US009800025B2

(12) United States Patent
Deshayes et al.

(10) Patent No.: US 9,800,025 B2
(45) Date of Patent: Oct. 24, 2017

(54) POWER SUPPLY CONTROLLER FOR AN ELECTRICAL ENERGY DISTRIBUTION NETWORK AND METHOD FOR MANUFACTURING THIS CONTROLLER

(71) Applicant: Zodiac Aero Electric, Montreuil (FR)

(72) Inventors: Olivier Deshayes, Toulouse (FR); Jérôme Jean-Louis Corneil Valire, Nogent-sur-Marne (FR)

(73) Assignee: Zodiac Aero Electric, Montreuil (FR)

( * ) Notice: Subject to any disclaimer, the term of this patent is extended or adjusted under 35 U.S.C. 154(b) by 0 days.

(21) Appl. No.: 14/975,398

(22) Filed: Dec. 18, 2015

(65) Prior Publication Data

US 2016/0190773 A1 Jun. 30, 2016

(30) Foreign Application Priority Data

Dec. 18, 2014 (FR) ...................................... 1462705

(51) Int. Cl.
*H02B 1/04* (2006.01)
*B60R 16/03* (2006.01)
*H05K 7/14* (2006.01)
*H02M 7/00* (2006.01)

(52) U.S. Cl.
CPC .............. *H02B 1/04* (2013.01); *B60R 16/03* (2013.01); *H02M 7/003* (2013.01); *H05K 7/1457* (2013.01)

(58) Field of Classification Search
CPC .......... H02B 1/04; H02B 1/015; B60R 16/03; H02M 7/003; H05K 7/1457
USPC ................................................ 361/622–656
See application file for complete search history.

(56) References Cited

U.S. PATENT DOCUMENTS

| | | | | |
|---|---|---|---|---|
| 4,685,029 A * | 8/1987 | Tillman | .................... | H02B 1/48 361/627 |
| 5,705,862 A * | 1/1998 | Lutz | ......................... | H02B 1/26 307/147 |
| 6,351,715 B1 * | 2/2002 | Ykema | ................ | H02J 13/0086 361/614 |
| 7,007,179 B2 * | 2/2006 | Mares | .................. | G05D 1/0077 307/43 |
| 7,020,790 B2 * | 3/2006 | Mares | .................. | G05D 1/0077 307/11 |
| 2002/0108065 A1 * | 8/2002 | Mares | .................. | G05D 1/0077 713/300 |
| 2006/0256508 A1 * | 11/2006 | Kim | ...................... | H05K 7/1457 361/622 |
| 2008/0055822 A1 * | 3/2008 | Rearick | ................... | H05K 7/186 361/641 |
| 2011/0188174 A1 * | 8/2011 | Simper | ................ | H05K 7/1457 361/676 |
| 2016/0048186 A1 * | 2/2016 | Pradier | ..................... | G06F 1/28 713/330 |

(Continued)

*Primary Examiner* — Anthony Haughton
*Assistant Examiner* — Yahya Ahmad
(74) *Attorney, Agent, or Firm* — Christensen O'Connor Johnson Kindness PLLC

(57) ABSTRACT

This power supply controller for an electrical energy distribution network comprises an electronic power card on which power modules are fitted and on which a set of at least one control module is fitted to control the power modules. The electronic card comprises control buses positioned between the control modules and power module fitting locations on which power modules are fitted according to the use of the controller, to form an electronic power card specific to a use of the power supply controller.

7 Claims, 6 Drawing Sheets

(56) References Cited

U.S. PATENT DOCUMENTS

| | | | |
|---|---|---|---|
| 2016/0149380 A1* | 5/2016 | Dickey | H02B 1/04 361/631 |
| 2016/0190773 A1* | 6/2016 | Deshayes | B60R 16/03 361/627 |
| 2017/0027076 A1* | 1/2017 | Deshayes | H05K 7/16 |
| 2017/0031400 A1* | 2/2017 | Balbinot | H02J 4/00 |

* cited by examiner

POWER SUPPLY CONTROLLER FOR AN ELECTRICAL ENERGY DISTRIBUTION NETWORK AND METHOD FOR MANUFACTURING THIS CONTROLLER

The present invention relates to power supply systems for an electrical energy distribution network, in particular for an electrical energy distribution network for an aircraft.

As is known, an electrical energy distribution network in an aircraft has a pyramidal structure.

The electrical power is initially produced using some of the power supplied by the aircraft engines to drive electrical energy generators. The electrical energy can also come from secondary sources such as batteries or external power supply units of an airport installation.

The electrical energy is supplied to a distribution system comprising, notably, a primary electrical energy distribution circuit and a secondary electrical energy distribution circuit. These primary and secondary distribution circuits, also called primary and secondary distribution units, distribute the electrical power obtained from different internal or external sources of the aircraft, while also protecting the cables and/or devices located downstream. These devices may form the payload or other distribution units of the aircraft.

As a general rule, the distribution units control the power supply of the distribution network of the aircraft.

They comprise electronic cards which themselves comprise a plurality of modules, namely power modules and control modules.

The power modules interact with the control modules to deliver the power required for controlling the various electrical and electronic components of the aircraft.

The power modules are generally composed of electronic power cards and can be configured to deliver an alternating or direct current.

The electronic control modules can generally be used to control one or more power modules and protect the loads to which the power modules are connected, by causing the power supply circuit of each load to be opened or closed according to a predetermined protection rating.

A prior art power supply controller of the semiconductor type for an aircraft is shown in FIG. 1.

This controller, generally designated by the term SSPC ("Solid State Power Controller"), comprises an electronic card 1 on which a set of control modules 2-1, 2-2, 2-3 and 2-4 are fitted.

As can be seen, in this case the first and third control modules 2-1 and 2-3 are connected to three power modules, such as 3, and control these power modules 3 to supply loads C1 and C3 respectively.

Two of these power modules can be controlled by the power modules 2-1 and 2-3 to provide four protection ratings Cal1, Cal2, Cal3 and Cal4, the other power module being controllable to provide a single protection rating Cal1.

With reference to FIG. 2 again, each of the power modules comprises a power switch S which selectively controls the supply to a line. Fuses F1 and F2, numbering two in this case, each associated with a surge protection diode D and D', each protect the line at a specified protection rating. Thus these fuses protect not only the whole electrical line of the electronic card 1, but also the electrical line outside the card.

The second and fourth control modules 2-2 and 2-4 are connected to a single power module 3 controlled so as to provide a single protection rating Cal1 for the power supply to respective loads C2 and C4.

Additionally, the first and third control modules 2-1 and 2-3 and the corresponding power modules 3 are intended to supply three-phase loads according to the protection ratings Cal1, Cal2, Cal3 or Cal4.

Conversely, the second and fourth control modules 2-2 and 2-4 and the corresponding power modules 3 supply a single-phase load.

As a general rule, the control modules and the power modules are not configurable. However, they are programmable to change the protection rating within certain limits, but in this case a number of output pins have to be provided for each programmed configuration.

In the context of the use of a power supply controller for an aircraft, the load configuration of the aircraft is highly varied, making it impossible to define an identical control and power module configuration for all the cards.

In all cases, as shown in FIG. 1, the card provides an output connector C for each protection rating, so that a relatively large number of output connectors is required for the whole power supply controller.

Consequently each SSPC controller has to be provided with all the control modules and power modules required to supply all the loads according to all the protection ratings to cover all the possible uses within the distribution units.

Various types of cards must also be provided to meet all the requirements.

An SSPC power supply controller is therefore equipped with all the power modules, already calibrated, even though only a few of these will ultimately be used.

Evidently, this type of solution is unfavourable in terms of both cost and weight, since it requires the fitting of electronic cards comprising modules and connectors that will not be used in the distribution units.

The object of the invention is therefore to overcome this drawback.

The invention therefore proposes, according to a first aspect, a power supply controller for an electrical energy distribution network, comprising an electronic power card on which power modules are fitted and on which a set of at least one control module is fitted to control the power modules.

The electronic card comprises control buses positioned between the control modules and power module fitting locations on which power modules are fitted according to the use of the controller, to form an electronic power card specific to a use of the controller.

The power supply controller can therefore be configured according to its end use, rather than according to the set of potential uses within a distribution unit.

According to another characteristic of the invention, the electronic card comprises first locations for the connection of power modules dedicated to the three-phase supply of a load and connected by three-phase buses to a control module and second locations for the connection of power modules dedicated to the single-phase supply of a load and connected by single-phase buses to a control module.

Advantageously, each of the connection locations is dedicated to a cut-out calibration.

According to yet another characteristic, the electronic card comprises means for recognizing the power modules when they are fitted on the connection locations, the connection of a load to the power module being controlled according to the nature of the power modules.

For example, these recognition means comprise means for decoding a code based on the connecting pins of the power modules.

In a particularly useful application of the invention, the power supply controller according to the invention forms an electricity distribution network controller for an aircraft.

The invention also proposes, according to another aspect, a method for manufacturing a power supply controller for an electrical energy distribution network, in which one or more power modules are selectively connected to fitting locations of an electronic card on which a set of at least one control module for controlling the power modules is fitted, the card comprising control buses positioned between the control modules and the power module fitting locations to form an electronic power card specific to a use of the power supply controller.

Other objects, characteristics and advantages of the invention will be apparent from the following description, provided solely by way of non-limiting example with reference to the attached drawings, in which:

FIG. 1, which has already been mentioned, shows the arrangement of a power supply controller according to the prior art;

Figure 4:
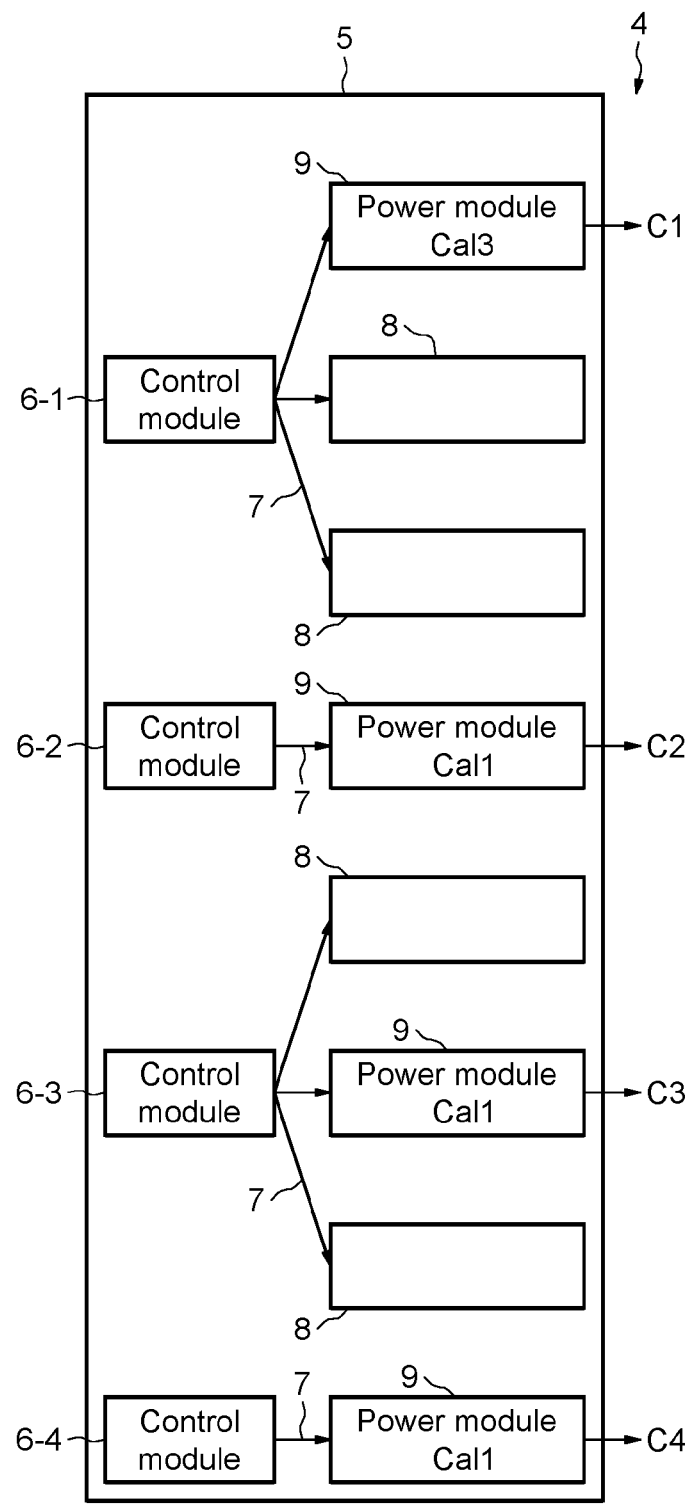

Reference will be made initially to FIG. 4, which illustrates the general architecture of an exemplary embodiment of a power supply controller according to the invention.

In the illustrated exemplary embodiment, the power supply controller, denoted by the general reference numeral 4, is intended to form an SSPC power supply controller for an electrical energy distribution network of an aircraft.

This controller 4 is intended to be incorporated in a distribution unit of the electrical distribution system of the aircraft.

The controller 4 comprises an electronic card 5 on which control modules 6-1, 6-2, 6-3 and 6-4, numbering four in this case, are mounted. The number of control modules used is purely illustrative, since the controller 4 can comprise any number of these control modules, notably a single control module capable of controlling the set of power modules of the controller.

The card 5 also comprises control buses such as 7, and locations 8 for fitting power modules which communicate with the control modules 6-1, . . . , 6-4 via the control buses 7.

Figure 3:
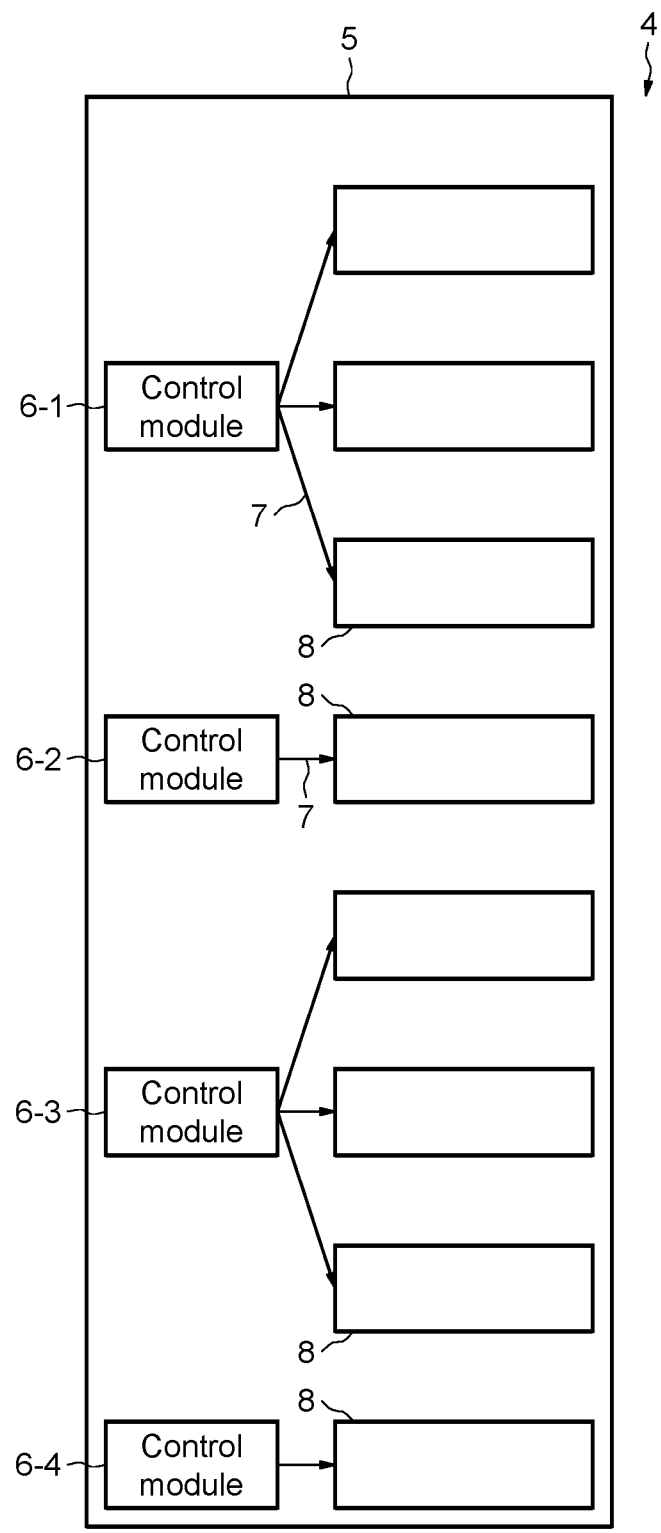
FIGS. 3 and 4 show the arrangement of a power supply controller according to the invention, before and after the fitting of the power modules, respectively.

The power supply controller shown in FIG. 3 is formed by a configurable card, each control module being capable of controlling one or more power modules which may or may not be fitted on fitting locations 8 according to requirements in the distribution cabinet.

In other words, the power modules are fitted on the fitting locations 8 only if they are actually used within the distribution unit.

Conversely, by contrast with the prior art, the control modules 6-1 and 6-3 which communicate via control buses 7 with three connection locations can be used to control a three-phase load or to control three single-phase loads, as required.

The same card can thus be used in either single-phase or three-phase mode.

For example, with reference a FIG. 4, the first control module 6-1 controls a single power module 9 at the protection rating Cal3, the second control module 6-2 controls a power module 9 at the rating Cal1, the third control module 6-3 controls a single power module 9 at the rating 1, and the fourth control module 6-4 control a power module 9 at the protection rating Cal1.

Thus the card is fitted with power modules at the desired rating, solely for the loads that are finally used. If a load is added, it is simply necessary to add a power module at the desired rating. Thus the SSPC card has no unused power modules.

Figure 5:
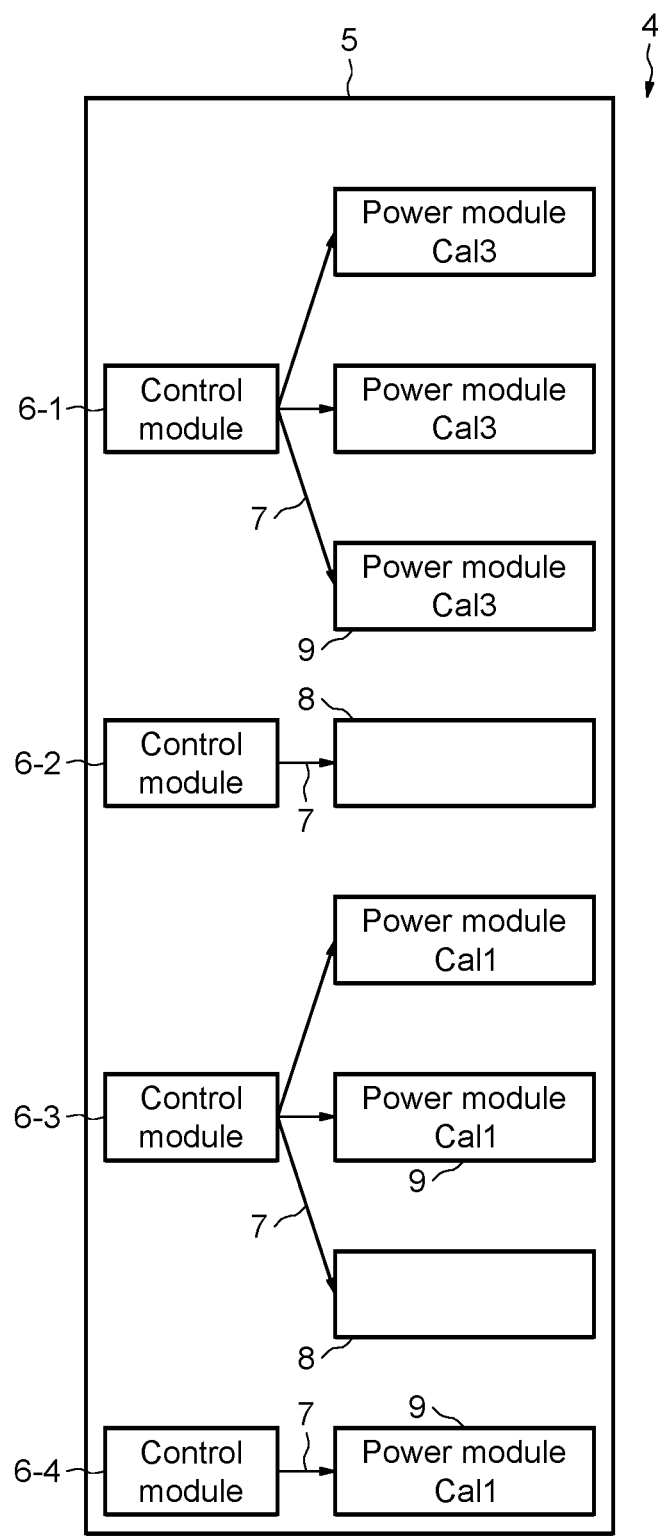
FIG. 5 shows another example of the fitting of power modules on the power supply controller of FIG. 1.

In another embodiment shown in FIG. 5, the first control module is used to control three power modules 9 at the protection rating 3; no power module is connected to the second control module 6-2; two power modules 9 at the protection rating Cal1 are connected to the third control module 6-3; and the fourth control module 6-4 controls a power module 9 at the protection rating Cal1.

It should also be noted that the connection locations 8 and the control module 6-1 to 6-4 communicate with one another, in particular to provide detection of the type of power modules connected to the connection locations 8.

Thus the control modules can provide protection calibration; that is to say, they can adapt the cut-out current or voltage according to the type of power modules fitted on the connection locations.

For this purpose, the control module comprises means for recognizing the type of power module that has been fitted on the connection locations, comprising means for detecting the type of connecting pins of the power module. For example, these recognition means comprise means for decoding a code, formed for example by the number and arrangement of the connecting pins of the power modules.

Figure 6:
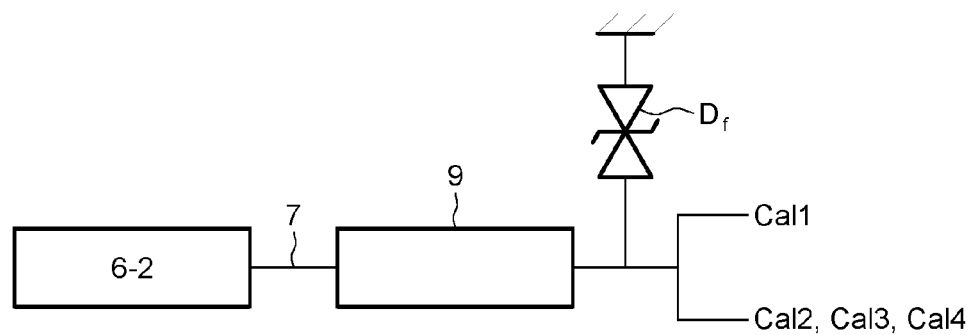
FIG. 6 is a synoptic diagram of an SSPC channel of the controller of FIG. 4.
Figure 7:
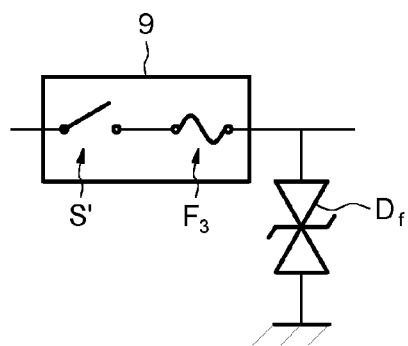
FIG. 7 shows schematically the use of the protection function of the power supply controller of FIG. 3.

Finally, reference will be made to FIGS. 6 and 7, which show a specific embodiment of an SSPC channel of the power supply controller of FIG. 4. FIG. 6 shows a hypothetical version of the second SSPC channel of the controller of FIG. 4, comprising the control module denoted 6-2 and the corresponding power module 9.

As can be seen, the power module 9 is associated, at its output, with a single surge protection diode $D_f$.

The power module 9 incorporates a power fuse $F_3$ associated with the protection rating Cal1, Cal2, Cal3 or Cal4 of the power module.

In other words, this power fuse F3 can be used to define the protection characteristic of the power module.

Figure 1:
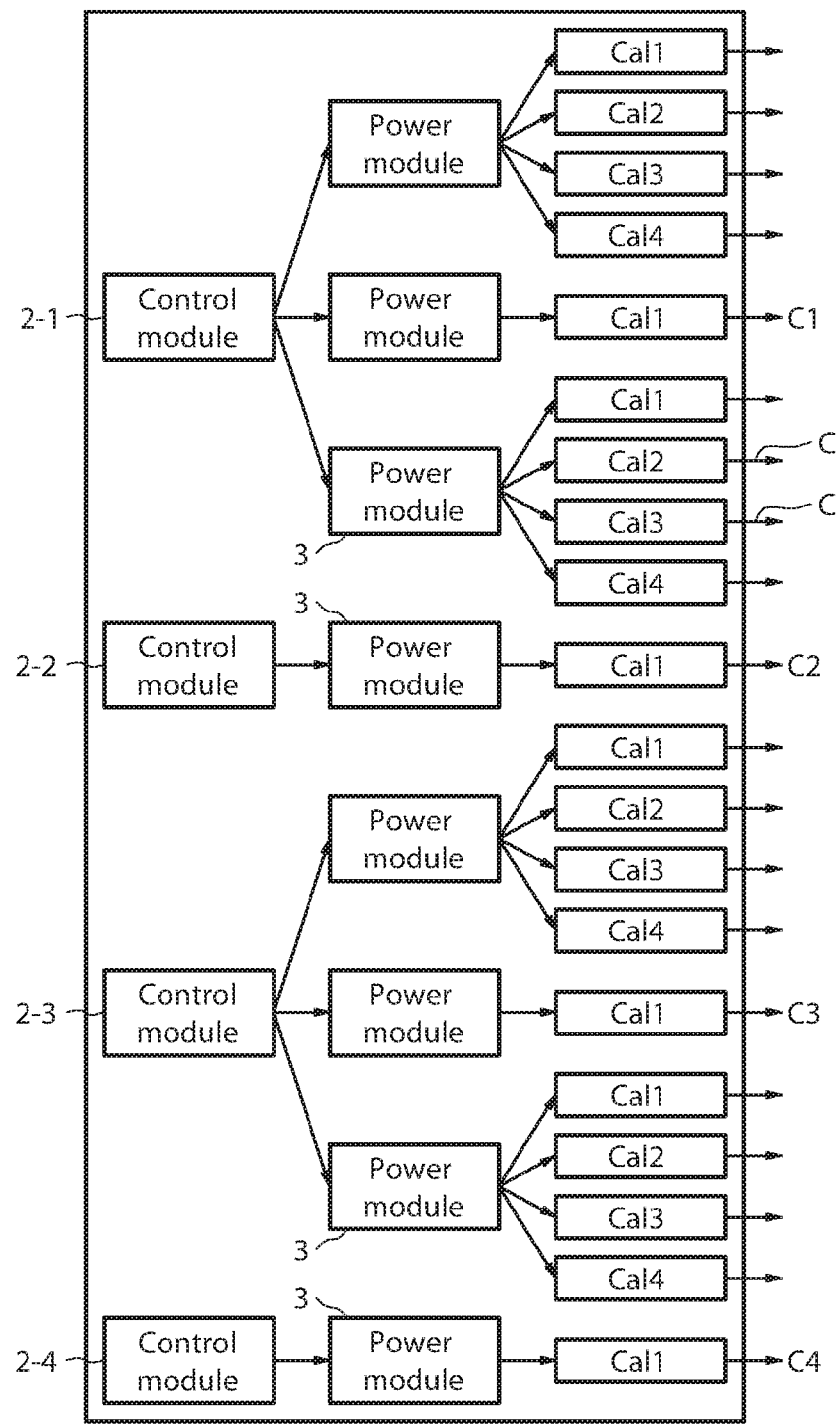
Figure 2:
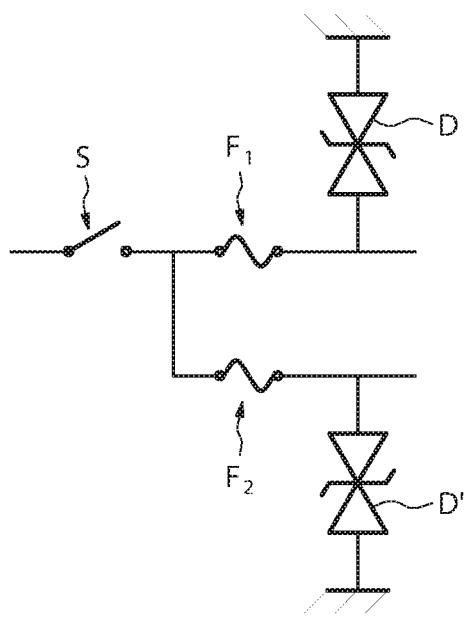
FIG. 2 shows schematically the use of the protection function of the power supply controller of FIG. 1.

This embodiment is advantageous compared with the prior art described above with reference to FIG. 2, in that a single surge protection diode is required, instead of one surge protection diode for each protection rating.

Additionally, the power module comprises a single fuse designed for the protection rating actually used, instead of a plurality of fuses.

However, it should be noted that the surge protection diode can be incorporated into the card 5, or even into the power module.

Finally, it should be noted that the connection of the power modules to the card 5 can be formed by any appropriate means.

For example, the modules can be fitted by screwing, which has the advantage of allowing simple and flexible fitting in the maintenance workshop, and enabling stocks of generic modules to be kept for producing the desired configuration immediately before the card is fitted on the aircraft.

The power modules can also be fitted by soldering, notably by SMC ("Surface Mount Component") soldering, or by clipping, fitting by soldering being advantageous in that it permits weight optimization, high reliability and reduced overall dimensions of the card.

The invention claimed is:

1. A power supply controller for an electrical energy distribution network, comprising an electronic power card (5) on which power modules (9) are fitted and on which at least one control module (6-1, 6-2, 6-3, 6-4) for controlling the power modules is fitted, characterized in that the electronic power card comprises control buses positioned between the at least one control module and power module fitting locations on which the power modules are fitted selectively according to the use of the power supply controller, to form an electronic power card specific to a use of the power supply controller.

2. The power supply controller according to claim 1, wherein the electronic power card comprises first locations for the connection of power modules connected by three control buses to a control module for supplying a three-phase load or three single-phase loads, and second locations for the connection of power modules dedicated to the single-phase supply of a load and connected by a single control bus to a control module.

3. The power supply controller according to claim 1, wherein each of the power module connection locations is dedicated to a different cut-out calibration.

4. The power supply controller according to claim 1, wherein the electronic power card comprises means for recognizing the power modules when they are fitted on the connection locations, the connection of a load to the power module being controlled according to the nature of the power modules.

5. The power supply controller according to claim 4, wherein the recognition means comprise means for decoding a code for each connecting pin of the power modules.

6. The power supply controller according to claim 1, characterized in that it forms an electricity distribution network controller for an aircraft.

7. A method for manufacturing a power supply controller for an electrical energy distribution network, characterized in that one or more power modules are selectively connected to fitting locations of an electronic power card on which at least one control module for controlling the one or more power modules is fitted, the electronic power card comprising control buses positioned between the at least one control module and the power module fitting locations, to form an electronic power card specific to a use of the power supply controller.

* * * * *